United States Patent [19]
Takeda et al.

[11] Patent Number: 6,054,226
[45] Date of Patent: Apr. 25, 2000

[54] MAGNETORESISTIVE ELEMENT AND MAGNETIC DETECTOR AND USE THEREOF

[75] Inventors: Hideki Takeda, Sendai; Tetsuya Katsumi, Miyagi, both of Japan

[73] Assignee: YKK Corporation, Tokyo, Japan

[21] Appl. No.: 08/997,473

[22] Filed: Dec. 23, 1997

[30] Foreign Application Priority Data

Dec. 27, 1996 [JP] Japan ................................. 8-349502

[51] Int. Cl.$^7$ ........................................... G11B 5/66
[52] U.S. Cl. ................ 428/682; 428/684 T; 428/684 R; 428/684 GT; 428/900
[58] Field of Search ................ 428/682, 684 T, 428/684 R, 684 GT, 900

[56] References Cited

U.S. PATENT DOCUMENTS 5,549,978  8/1996  Iwasaki ................................. 428/692

FOREIGN PATENT DOCUMENTS 5-63249  3/1993  Japan .
563249   3/1993  Japan .

*Primary Examiner*—Leszek Kiliman
*Attorney, Agent, or Firm*—Finnegan, Henderson, Farabow, Garrett & Dunner, L.L.P.

[57] ABSTRACT

A magnetoresistive element comprising a combination of an electroconductive, crystalline magnetostrictive material or an amorphous magnetostrictive material with an electrically insulating layer and an oxide magnetoresistive material, or a combination of an electrically insulating oxide magnetostrictive material with an oxide magnetoresistive material. The magnetoresistive element provides a magnetic detecting element, detector or recording device having high sensitivity and good quick response by virtue of synergistic effect of the large magnetostriction and the magnetoresistance effect thereof. The oxide magnetoresistive material is preferably an oxide having a perovskite structure or a layer perovskite structure and the preferred magnetostrictive material is a crystalline or amorphous ferromagnetic material. The electrically insulating layer is formed of preferably an oxide having a perovskite structure.

19 Claims, 5 Drawing Sheets

MAGNETORESISTIVE ELEMENT AND MAGNETIC DETECTOR AND USE THEREOF

BACKGROUND OF THE INVENTION

1. Field of the Invention

The present invention relates to a laminate film using a magnetic material and in particular to a magnetization-conduction interactive element, using the same, having magnetoresistance effect with high sensitivity.

2. Description of the Prior Art

Conventional magnetoresistive elements using a magnetic material include those constructed of a magnetic metal/nonmagnetic metal or laminate films, such as magnetic oxide/superconducting oxide/magnetic oxide, described in Japanese Patent Laid-Open No. 63249/1993.

A magnetoresistive element prepared by using the conventional laminate film exhibits a magnetoresistance effect as low as about 10% in a strong magnetic field of not less than 1000 Oe, or, even though the magnetoresistance effect could be attained in a magnetic filed of several Oe, exhibits a magnetoresistance effect as low as about 5%. Thus, the magnetoresistive element, when used as a magnetic sensor, creates only a small signal change, requiring a signal amplifier and signal calibration. Therefore, the construction becomes complicate, posing a problem that the cost involved in auxiliary devices is higher than that of the sensor per se. Further, since a switch utilizing magnetism is mechanically operated, there are problems associated with durability of a movable section, a large size of the movable section, limitation of the place where the switch may be installed. On the other hand, the perovskite type ferromagnetic material exhibits a large signal change. It, however, has a problem that somewhat large magnetic field is necessary. The present invention provides a simple magnetic sensor and a device material which can eliminate the need to provide any auxiliary device, such as an amplifier.

SUMMARY OF THE INVENTION

The present invention provides a magnetoresistive element comprising a combination of an electroconductive, crystalline magnetostrictive material or an amorphous magnetostrictive material with an electrically insulating layer and an oxide magnetoresistive material, or a combination of an electrically insulating oxide magnetostrictive material with an oxide magnetoresistive material.

The oxide magnetoresistive material is an oxide comprising a trivalent element, such as Mn and a rare earth element, as a main constituent element, which exhibits ferromagnetism upon deficit of a divalent element, such as an alkaline earth metal, a monovalent element, such as an alkali metal, or oxygen or a deviation from a stoichiometric ratio although it usually exhibits antiferromagnetism at the magnetic transition temperature or below. This material exhibits metal-like low electrical resistance in a ferromagnetic state at a temperature higher than the magnetic transition temperature. On the other hand, it exhibits semiconductor- or insulator-like high electrical resistance in a paramagnetic state at a magnetic transition temperature or above. In this magnetoresistive material, an electron of a main element, for example, Mn, is responsible for magnetization and conduction, and the magnetoresistance effect is created through a close relationship between the magnetization and the conduction. This effect has become studied as CMR effect from around 1994. Operation at room temperature, however, requires a magnetic field as high as several tens of T, and operation at a low magnetic field is necessary for utilization in a sensor or the like. This magnetoresistive material is an oxide which comprises, for example, manganese as a main constituent element, and the magnetic properties and electrical properties have a close relationship with the crystal structure. For example, when the rare earth element is changed, in other words, when the ion radius is changed, the magnetic transition temperature is also changed. This is attributable to a change in a main element responsible for conduction and a relationship between the main element (for example, manganese) and oxygen. Further, application of pressure results in a change in relative distance between main elements, leading to a change in magnetic transition temperature.

Thus, for the magnetization-conduction interactive element of the ferromagnetic oxide, the magnetization-conduction interaction is sensitive to external energy, that is, stimuli, such as electromagnetic wave, electric field, magnetic field, light, pressure, heat, and sound. When a current is allowed to flow during creation of the magnetization-conduction interaction, the electron responsible for the conduction and the electron of manganese cause the magnetization-conduction interaction. In this case, a change in interaction is detected as a change in electrical resistance. The oxide magnetoresistive material is an oxide having a perovskite structure $DEMnO_3$ or a layer perovskite structure $DE_{2n-1}Mn_nO_{2n+1}$ wherein DE represents at least one element selected from the group consisting of rare earth elements and alkaline earth elements and n represents an integer of one or more. Specific examples thereof include $(La, Ca)_1Mn_1O_y$; $(La, Sr)_1Mn_1O_y$; $Bi_1Mn_1O_y$; $(La, A) Mn_{1-x}(Co, Fe, Ni)_xO_y$ wherein A represents at least one element selected from the group consisting of Ba, Sr, Pb, and Cd; $(D, E)_1Mn_{1-x}G_xO_y$ wherein D represents at least one rare earth element, E represents at least one alkaline earth element and G represents at least one element selected from the group consisting of Fe, Co, Ni, and Cr; $\{(Pr, Nd), (Ba, Sr)\}_1(Mn_{1-x}G_x)_1O_y$ $(Bi, Ca)_1(Mn_{1-x}G_x)_1O_y$; $La_1(Mn_{1-x}G_x)_1O_y$; $Gd_1(Mn_{1-x}G_x)_1O_y$; $J(L, M)_1O_y$ wherein J represents at least one element selected from the group consisting of Ba, Ca, Sr, and Pb, L represents at least one element selected from the group consisting of Ni, Mn, Cr, and Fe, and M represents at least one element selected from the group consisting of W, Sb, Mo, and V; $(Sr, La)_1Mn_{1-x}Q_xO_y$ wherein Q represents at least one element selected from the group consisting of Co, Ni, Nb, Sb, and Ta; $La_3Mn_2O_z$; $(La, J)_3Mn_2O_z$; and $(La, J)_3(Mn, L)_2O_z$, wherein, in the formulae, x=more than 0 to 3.5, y=2.7 to 3.3, and z=5 to 8. In the present specification, for example, "(La, Ca)" means that the material contains at least one of La and Ca.

The electrically insulating layer is formed of preferably an oxide having a perovskite structure, and examples of materials usable herein include $RO_y$ wherein R represents at least one element selected from the group consisting of Si, Ti, Mo, W, Zr, Ta, Cr, Al, Mg, Hf, and Ca and y is 1.4 to 2.2; $DO_y$ wherein D represents at least one rare earth element; $JTiO_z$ wherein J represents at least one element selected from the group consisting of Ba, Ca, Sr, and Pb, and z is 2.7 to 3.3; $Pb_1\{(Zr, Ti), L\}_1O_z$ wherein L represents at least one element selected from the group consisting of Ni, Mn, Cr, and Fe, said materials having an electric resistance of not less than $10^7$ Ω·cm.

The thickness of the electrically insulating layer is preferably 0.001 to 1.0 μm, desirably 0.003 to 0.1 μm. The oxide magnetoresistive material should be physically strongly bonded to the magnetostrictive material, and, in the present invention, the insulating layer should be thin while maintaining the electrically insulating property. In the present invention, the thickness could be brought to about 0.1 $\mu$m by virtue of aligned epitaxial growth using the perovskite oxide.

The magnetostrictive material is preferably a ferromagnetic material, and use of crystalline metals, amorphous metals, and oxides is particularly preferred.

Preferred ferromagnetic, crystalline metals usable in the present invention include those represented by the general formulae $DFe_2$, $DFe_3$, $D_6Fe_{23}$, and $D_2Fe_{17}$ wherein D represents at least one rare earth element.

Specific examples thereof include materials containing not less than 50% by volume of any one of the following material: $TbFe_2$; $SmFe_2$; $T(Fe_{1-x}X_x)_2$; $T(Fe_{1-x}X_x)_3$; $T_6(Fe_{1-x}X_x)_{23}$; and $T_2(Fe_{1-x}X_x)_{17}$ wherein T represents at least one element selected from the group consisting of Tb, Dy, Ho, Sm, Gd, Tm, and Er, X represents at least one element selected from the group consisting of Ti, V, Cr, Mn, Co, Ni, and Cu, and x is preferably more than 0 to 0.5. The term "crystalline metal" refers to all metals wherein a crystalline phase (not an amorphous phase) is present.

Preferred ferromagnetic, amorphous metals usable herein include those represented by the general formulae $DFexMey$, $DFe_3$, $D_6Fe_{23}$, and $D_2Fe_{17}$ wherein D represents at least one rare earth element, Me represents at least one element of semimetallic material, x is 1.8 to 10, and y is 0 to 0.1).

Specific examples of ferromagnetic, amorphous metals usable herein include materials containing not less than 50% by volume of any one of the following materials: $TbFe_2B_{0.01}$; $SmFe_2B_{0.01}$; $T(Fe_{1-x}X_x)_2Z_y$; $T(Fe_{1-x}X_x)_3Z_y$; $T_6(FE_{1-x}X_x)_{23}Z_y$; and $T_2(Fe_{1-x}X_x)_{17}Z_y$ wherein T represents at least one element selected from the group consisting of Tb, Dy, Ho, Sm, Gd, Tm, and Er, X represents at least one element selected from the group consisting of Ti, V, Cr, Mn, Co, Ni, and Cu, Z represents at least one element selected from the group consisting of B, C, Si, P, S, As, Se, Sb, and Te, x=more than 0 to 0.5, and y=more than 0 to 0.1.

Preferred magnetostrictive oxide magnetic materials usable herein include ferrite, iron having a spinel structure, and cobalt oxide.

Specific examples of oxide magnetostrictive materials usable in the present invention include $NiFe_2O_4$; $Co_1Fe_2O_4$; $Y_3Fe_5O_{12}$; $Fe_3O_4$; $(Ba, Pb)Fe_2O_4$; and $BaFe_{12}O_{19}$.

The magnetic detecting element (magnetization-conduction interactive element) according to the present invention comprises: a laminate structure of a multilayer film comprising two or more layers formed of a magnetostrictive material and an oxide magnetoresistive material; a means for allowing a current to flow into the oxide magnetoresistive material; and a means for detecting a voltage created in the oxide magnetoresistive material. The laminate film comprises: a thin film of an oxide magnetoresistive material composed of an Mn-based perovskite oxide; and a ferromagnetic magnetostrictive material. The minimum unit has two layers. However, when the magnetostrictive material is electrically conductive, an insulating layer is provided between the two layers. In this case, the minimum unit has three layers.

The magnetic detector of the present invention comprises: a laminate structure of a multilayer film comprising two or more layers formed of a magnetostrictive material and an oxide magnetoresistive material; a means for allowing a current to flow into the oxide magnetoresistive material; a means for detecting a voltage created in the oxide magnetoresistive material; and a means for externally applying energy to the laminate film. The means for allowing a current to flow into the oxide magnetoresistive material is a means wherein a current is fed through electrodes of Pt, Ag, Au, Cu or the like. The voltage created at that time is monitored by a voltmeter. The terminals for detecting the voltage may be the same as those for feeding the current. An actuator, a switch element, and a power source as a load can be directly regulated by varying the current flowing through the oxide magnetoresistive material. In this case, only the terminals for allowing a current to flow are necessary.

Externally applying energy, such as electromagnetic wave, magnetic field, light, sound, pressure, or heat, to the magnetic detector causes the sequence of magnetic spins of manganese to respond thereto with a high sensitivity and to be changed. This change can be read as a change in voltage or current. Therefore, the magnetic detector can be utilized as a highly sensitive detector or actuator.

Further, the present invention provides a magnetic detector and a current control element, comprising: a substrate; a laminate film comprising an oxide magnetoresistive material provided onto the substrate and an electroconductive, crystalline magnetostrictive material or an electroconductive, amorphous magnetostrictive material laminated on the magnetoresistive material through an electrically insulating oxide layer; a means for allowing a current to flow into the oxide magnetoresistive material; and a means for detecting a voltage created in the oxide magnetoresistive material, magnetism being detected based on a change in electrical resistance of the laminate film in response to the magnetism in the case of the magnetic detector, magnetism being utilized to vary the current in the case of the current control element.

As another arrangement of the above laminate film, the magnetostrictive material is provided as a lower layer on the substrate and the oxide magnetoresistive material is provided as an upper layer through the insulating oxide layer.

Further, the present invention provides a magnetic detector and a current control element, comprising: a substrate; a laminate film comprising an oxide magnetoresistive material provided onto the substrate and an electrically insulating magnetostrictive material laminated on the oxide magnetoresistive material; a means for allowing a current to flow into the oxide magnetoresistive material; and a means for detecting a voltage created in the oxide magnetoresistive material, magnetism being detected based on a change in electrical resistance of the laminate film in response to the magnetism in the case of the magnetic detector, magnetism being utilized to vary the current in the case of the current control element.

As another embodiment of the laminate film, the film may be formed by laminating the electrically insulating magnetostrictive material and then the oxide magnetoresistive material onto the substrate.

The above magnetoresistive element comprising a laminate film may be used as a magnetic detector as follows.

In a three-layer film comprising an electrically insulating layer provided between the electroconductive magnetostrictive material and the oxide magnetoresistive material, an electrode is provided on the oxide magnetoresistive material and connected to the means for feeding a current. Further, an electrode for detecting the voltage in the three-layer structure portion of the film and a means for detecting this are connected. Application of a magnetic field to the element having such a three-layer film results in a change in electrical resistance of the oxide magnetoresistive material.

When a current is allowed to flow into the electrode, a change in voltage in the electrode for detecting the voltage can be monitored, rendering the element utilizable in a magnetic field detecting element or detector.

On the other hand, in a two-layer film comprising an electrically insulating magnetostrictive material and an oxide magnetoresistive material, an electrode is provided on the oxide magnetoresistive material and connected to the means for feeding a current. Further, an electrode for detecting the voltage in the two-layer structure portion of the film and a means for detecting this are connected. Application of a magnetic field to the element having such a two-layer film results in a change in electrical resistance of the oxide magnetoresistive material. When a current is allowed to flow into the electrode, a change in voltage in the electrode for detecting the voltage can be monitored, rendering the element utilizable in a magnetic field detecting element or detector. This element has an advantage over the above element using an electroconductive magnetostrictive material in that the structure is simpler.

For the above construction, two current terminals for permitting a current to flow in the longitudinal direction within a film plane and two voltage terminals for detecting the voltage created at that time are provided in the laminate film on the substrate. Further, this assembly is fixed on a support and connected to a current supply means and a voltage detection means. In this state, external application of a magnetic field to the magnetic detector results in a change in voltage created in the voltage terminal depending upon the magnitude of the applied magnetic field, making it possible to detect the magnetic field. The current terminals may be the same as the voltage terminal.

The percentage voltage change in this case amounts to 500% to 1,000% which is larger by two or more orders than that attained by the conventional magnetoresistive element. The specific resistance of the oxide magnetoresistive material is 1 to 10 m$\Omega$·cm, and the absolute value of the created voltage is increased 4 to 5 orders over that in the conventional magnetoresistive element. Therefore, a magnetic detecting element or detector having a high S/N ratio can be provided. Further, the current value during the operation of the element can be reduced to about several microamperes, inhibiting generation of heat in the electrode and the wiring section and preventing a deterioration of the magnetoresistive film caused by heat generation.

A metallic, magnetic material, such as a permalloy (Ni—Fe), has been mainly used in a ferromagnetic material for use in the conventional magnetic head, that is, in a magnetoresistive film. By contrast, according to the present invention, the specific resistance of the magnetic material is as high as several tens of $\mu\Omega$·cm. Therefore, unlike the prior art wherein the magnetoresistive film in the element is brought to a very small thickness of not more than several hundreds of Å in order to provide high reproduction output, the present invention can eliminate the need to render the film very thin. Further, there is no need to increase the current fed into the element. Therefore, the preparation of the above film having such a small thickness is not required, and, in addition, a problem of a lowering in sensitivity derived from an increase in coercive force due to pinholes in the film is not posed. Furthermore, it is unnecessary to feed a large current, overcoming a problem that the deterioration of the element is accelerated due to heat generation or the like.

"Giant magnetoresistance effect" which is a phenomenon different from the above magnetoresistance effect has been proposed. The "giant magnetoresistance effect" refers to such a phenomenon that a very large magnetoresistance effect appears in a laminate film having a three-layer structure of a nonmagnetic material sandwiched between ferromagnetic materials. This phenomenon is created by spin interaction between the upper ferromagnetic material and the lower ferromagnetic material through the nonmagnetic layer. The magnetic detecting element or detector utilizing this phenomenon has a problem that the detection sensitivity is low although the reproduction output is somewhat high. According to the present invention, however, this problem can be solved.

Further, there is a ferromagnetic tunnel junction element as a magnetic detecting element based on a principle different from that of the above magnetic detecting element. This element comprises a very thin insulator, with a thickness of several tens of Å, sandwiched between thin films of a ferromagnetic material and can be utilized as a high-sensitivity and high-output magnetic detecting element. The ferromagnetic tunneling phenomenon occurs only at a very low temperature, making it difficult to apply this phenomenon to the magnetic detecting element. According to the present invention, however, this problem can be solved, and use of the element around room temperature is possible.

Further, the present invention provides a magnetic recording device adapted for reading a magnetic signal, recorded in a magnetic recording medium, with the aid of a magnetic detecting element, wherein the magnetic detecting element has a laminate film having a three-layer structure of an insulating oxide sandwiched between magnetic materials (i.e., the foregoing oxide magnetoresistive material and electroconductive crystalline or amorphous magnetostrictive material) and the laminate film reads a magnetic signal recorded in the magnetic recording medium. When the magnetic detecting element approaches the magnetic recording medium with information recording thereon, the magnetic field from the magnetic recording medium leads to a change in, for example, detection voltage, permitting information written in the magnetic recording medium to be read.

Further, the present invention provides a method for using a magnetic detector, the detector comprising a substrate; and a laminate film of an oxide magnetoresistive material provided on the substrate and an electrically insulating magnetostrictive material laminated onto the oxide magnetoresistive material, the magnetic detector being used in a wide temperature range of 50° K to 400° K by regulating the magnetic transition temperature of the oxide magnetoresistive material. Instead of the electrically insulating magnetostrictive material, an electroconductive oxide magnetostrictive material may be laminated on the oxide magnetoresistive material through the insulating oxide layer interposed therebetween.

Also, as set forth above, the magnetostrictive material and the oxide magnetoresistive material may be provided as a lower layer and an upper layer, respectively, in the foregoing two types of magnetic detectors.

The magnetoresistive element of the present invention can be used in a recording device in a computing system for a large-size computer, a personal computer or the like. Further, it can also be used as a recording device for an optical communication system or an optical operation system, or as an arithmetic element.

Preferably, the preparation of the laminate film having a two-layer structure by laminating an oxide magnetoresistive material and a magnetostrictive material or a three-layer structure by laminating an oxide magnetoresistive material and a magnetostrictive material with an insulating layer interposed between these materials may be done by sputtering, ion beam sputtering, vacuum deposition, laser ablation, coating from sol-gel followed by sintering, and the like. It is also possible to prepare the laminate film on a substrate, such as a single crystal substrate of lanthanum-aluminum oxide, a single crystal substrate of strontium titanate, a single crystal substrate of magnesium oxide, or a single crystal substrate of zirconium oxide. The substrate is preferably a glass substrate, a single crystal substrate of silicon, a single crystal substrate of gallium arsenic, a single crystal substrate of gadolinium gallium garnet or the like. Preferably, each magnetoresistive material layer and each magnetostrictive material layer are mutually grown in an epitaxial orientation relationship.

In the preparation of a laminate film, in the case of an oxide magnetoresistive material, the substrate temperature is set at an optimal temperature between 300° C. and 800° C., and an oxidizing atmosphere (such as $O_2$, $O_3$, $N_2O$, $NO_2$ or the like) is introduced to prepare the oxide magnetoresistive material layer. In the case of an insulating layer, the substrate temperature is set at an optimal temperature between 300° C. and 800° C., and the insulating layer is then prepared in an oxidizing atmosphere ($O_2$, $O_3$, $N_2O$, $NO_2$ or the like) or in vacuo. In the case of a metal, the substrate temperature is set at an optimal temperature between room temperature and 500° C., and the metallic layer is then prepared in an air atmosphere of not more than $10^{-3}$ Torr, an inert gas atmosphere of not more than 1 Torr, or in vacuo. When the oxide film is formed by sputtering, laser deposition or coating, a sintered target or a raw material powder having a predetermined composition is preferably used, while in the case of vacuum deposition, an alloy vapor deposition source of a metal or an alloy having a predetermined chemical composition is preferably used.

The present invention may be used in a magnetic recording device as follows. A means for feeding a current to the magnetic detecting element according to the present invention and a means for detecting the voltage of the element are connected, and, separately from the magnetic detecting element, the element for writing an information signal on a magnetic recording medium, that is, the so-called "magnetic head for recording" is mounted on the same support. The support moves the element to a predetermined position of the magnetic recording medium by taking advantage of a drive system controlled by a control section so that an information signal can be written or read. This realizes a high-density, large-capacity, and small-size magnetic recording device.

When the laminate film according to the present invention is utilized in the magnetic detecting element, detector or recording device, it is preferably utilized at a temperature around the magnetic transition temperature of the oxide magnetoresistive material. This is because alignment-unalignment of the magnetization can be easily created by means of an external energy in this temperature range. Use of the laminate film according to the present invention in the above temperature range can realize a magnetic detecting element, detector or recording device having a high detection sensitivity and a high output unattainable by the prior art.

DETAILED DESCRIPTION OF THE PREFERRED EMBODIMENTS

Use of the oxide magnetoresistive material and the magnetostrictive material permits magnetostriction to apply strain to the oxide magnetoresistive material.

Further, use of the oxide magnetoresistive material and the magnetostrictive material permits the magnetic transition temperature of the oxide magnetoresistive material to be varied.

Use of the oxide magnetoresistive material and the magnetostrictive material changes the magnetization-conduction interaction of the oxide magnetoresistive material. Upon application of a magnetic field, the magnetization of the oxide magnetoresistive material is created. At the same time, application of strain to the oxide magnetoresistive material by the magnetostrictive material raises the magnetic transition temperature, and the magnetization of the oxide magnetoresistive material is created at a temperature around the magnetic transition temperature. Creation of the magnetization results in a change in electrical conductivity from a semiconductive or insulating property to a metallic property. This creates a giant magnetoresistance effect in the laminate film of the oxide magnetoresistive material and the magnetostrictive material, making it possible to provide a high-sensitivity, high-output element utilizable as a magnetic detecting element or detector.

Further, in a laminate film having a two-layer structure prepared by laminating an oxide magnetoresistive material and a magnetostrictive material onto a substrate or a three-layer structure prepared by laminating an oxide magnetoresistive material, a magnetostrictive material, and an insulating layer provided between the oxide magnetoresistive material and the magnetostrictive material, a current is fed into the oxide magnetoresistive material, and a magnetic field is externally applied. This permits the applied magnetic field to increase the magnetization of the magnetoresistive material at a temperature around the magnetic transition temperature, and, at the same time, the magnetostrictive material is strained by the magnetic field, causing the magnetoresistive oxide to be also strained. This in turn changes the magnetic transition temperature, and the magnetization-conduction interaction functions so that the voltage created in the laminate section changes according to the magnetic field.

Further, when the magnetic detecting element of the present invention is used as a means for reading a signal recorded in the magnetic recording medium, the voltage created in the element varies depending upon the magnetic field applied from the magnetic recording medium to the element.

EXAMPLES

Embodiments of the present invention will be described with reference to FIG. 1(a) and FIG. 1(b).

Figure 1A:
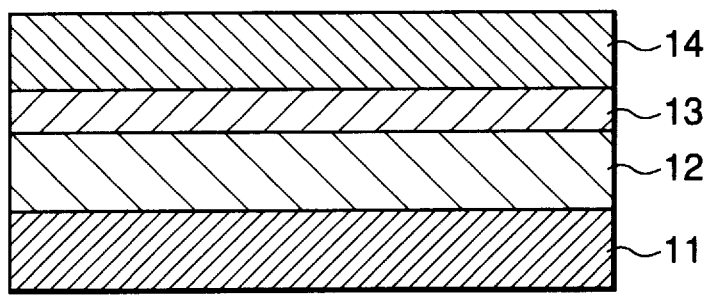
FIG. 1(a) and FIG. 1(b) are cross-sectional views of two laminate films having a three-layer structure prepared by lamination.
Figure 1B:
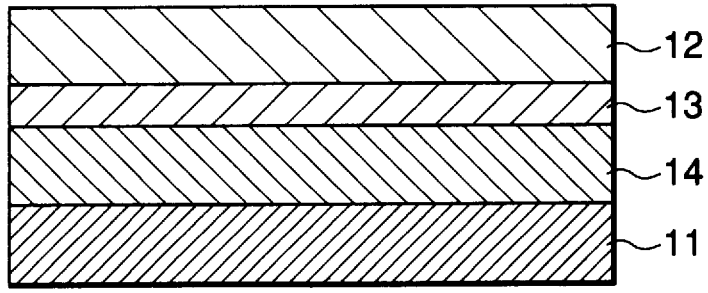

FIGS. 1(a) and (b) are cross-sectional views of two respective laminate films having a three-layer structure on the substrate 11. In FIGS. 1(a) and 1(b), numeral 12 designates an oxide magnetoresistive material layer, numeral 13 an insulating layer, and numeral 14 a magnetostrictive material layer. In this case, the insulating layer was formed of $SrTiO_x$ (wherein x is 2.7 to 3.3), the oxide magnetoresistive material was $La_{1-x}Sr_xMnO_y$ (wherein x is 0.15 to 0.3 and y is 2.7 to 3.3), and the magnetostrictive material was $SmFe_2$, $SmFe_2B_{0.01}$, or $Co_2Fe_2O_4$. In this case, as shown in FIGS. 1(a) and (b), any of the oxide magnetoresistive material and the magnetostrictive material may be laminated as an upper layer through the insulating layer. Further, a single crystal which had been subjected to mirror polishing was used as the substrate 11.

Regarding the thickness of the layers constituting the laminate film having a three-layer structure, a 10 nm-thick insulating layer 13, a 100 nm-thick oxide magnetoresistive material layer 12, and a 500 nm-thick magnetostrictive material layer 14 were formed on an $LaAlO_3$(100) substrate 11 having a size of 10 mm×10 mm×0.5 mm. When the magnetostrictive material is not electrically conductive, the insulating layer 13 may be omitted.

One example of film forming conditions for an electroconductive magnetostrictive material is summarized in Table 1, and one example of film forming conditions for a magnetostrictive material not having an electrical conductive property is summarized in Table 2.

Figure 2A:
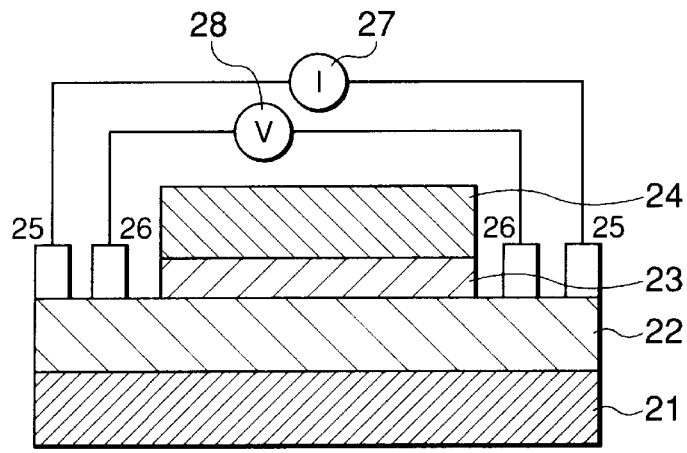
FIG. 2(a) and FIG. 2(b) are cross-sectional views of two magnetic detectors prepared by lamination according to the present invention.
Figure 2B:
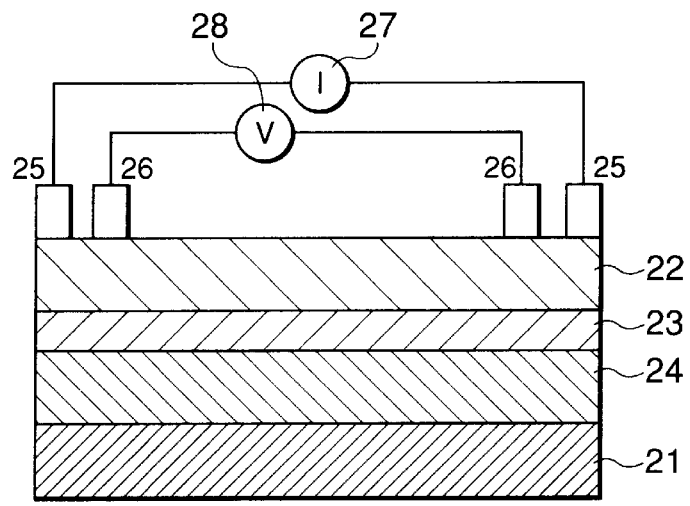

Table 1
Oxide magnetoresistive material layer
  Layer species: $La_{0.75}Nd_{0.05}Sr_{0.15}Ca_{0.05}MnO_y$
  [LNSCMO]
  Layer forming method: Laser vapor deposition
  Substrate: Single crystal $LaAlO_3$(100) face
  Substrate temperature: 650° C.
  Gas species/partial pressure: Oxygen
  Atmosphere/total pressure: $1\times10^{-4}$ Torr
  Laser energy: 1 $J/cm^2$/pulse×10 Hz
  Layer formation rate: 0.05 nm/sec
  Layer thickness: 100 nm
Insulating layer
  Layer species: $SrTiO_2$
  Layer forming method: Laser vapor deposition
  Substrate: On LNSCMO
  Substrate temperature: 400° C.
  Gas species/partial pressure: Oxygen
  Atmosphere/total pressure: $1\times10^{-4}$ Torr
  Laser energy: 1 $J/cm^2$/pulse×10 Hz
  Layer formation rate: 0.05 nm/sec
  Layer thickness: 10 nm
Magnetostriction layer
  Layer species: $SmFe_2$
  Layer forming method: DC magnetron sputtering
  Substrate: On $SrTiO_2$
  Substrate temperature: 200° C.
  Gas species: Ar
  Total pressure: $2\times10^{-4}$ Torr
  Sputtering energy: 600 V×0.2 A
  Layer formation rate: 0.5 nm/sec
  Layer thickness: 500 nm Table 2
Oxide magnetoresistive material layer
  Layer species: $La_{0.75}Nd_{0.05}Sr_{0.15}Ca_{0.05}MnO_y$
  [LNSCMO]
  Layer forming method: Laser vapor deposition
  Substrate: Single crystal $LaAlO_3$(100) face
  Substrate temperature: 650° C.
  Gas species/partial pressure: Oxygen
  Atmosphere/total pressure: $1\times10^{-4}$ Torr
  Laser energy: 1 $J/cm^2$/pulse×10 Hz
  Layer formation rate: 0.05 nm/sec
  Layer thickness: 100 nm
Magnetostriction layer
  Layer species: $Co_2Fe_2O_z$
  Layer forming method: Laser vapor deposition
  Substrate: On LNSCMO
  Substrate temperature: 550° C.
  Gas species/partial pressure: Oxygen
  Atmosphere/total pressure: $1\times10^{-4}$ Torr
  Laser energy: 1 $J/cm^2$/pulse×10 Hz
  Layer formation rate: 0.05 nm/sec
  Layer thickness: 500 nm Embodiments of an application of the laminate film having a three-layer structure or a two-layer structure to a magnetic detector are shown in FIG. 2(a) and FIG. 2(b). FIG. 2(a) and FIG. 2(b) are schematic cross-sectional views of magnetic detectors.

In the preparation of the magnetic detector shown in FIGS. 2(a) and (b), an oxide magnetoresistive material layer 22 of $La_{0.75}Nd_{0.05}Sr_{0.15}Ca_{0.05}MnO_z$ (wherein z is 2.7 to 3.3), an insulating layer 23 of SrTiOy (wherein y is 2.7 to 3.3), and a magnetostrictive material layer 24 of $SmFe_2$ are formed in that order on a substrate 21 of a single crystal $LaAlO_3$ in the same manner as described above [FIG. 2(a)]. Alternatively, a magnetostrictive material layer 24 of $SmFe_2$, an insulating layer 23 of SrTiOy (wherein y is 2.7 to 3.3), and an oxide magnetoresistive material layer 22 of $La_{0.75}Nd_{0.05}Sr_{0.15}Ca_{0.05}MnO_z$ (wherein z is 2.7 to 3.3) are formed in that order on a substrate 21 of a single crystal $LaAlO_3$ in the same manner as described above [FIG. 2(b)].

Electrodes 25 of Pt for applying a current to the oxide magnetoresistive material 22 are formed on the oxide magnetoresistive material 22. In FIGS. 2(a) and (b), numeral 27 designates a current source, for applying a current through the electrode 25, which permits a current of 1 $\mu$A to flow into the oxide magnetoresistive layer 22.

Electrodes 26 of Pt are formed so that the voltage created in the laminate section upon application of a current to the oxide magnetoresistive material 22 can be detected with a voltmeter 28.

Application of a magnetic field in the range of −1 kOe to 1 kOe to the detector so as to be parallel to the oxide magnetoresistive material layer causes the electrical resistance of the oxide magnetoresistive material to be changed in response to the magnetic field, resulting in a change in a voltage between the electrodes 26.

Figure 3:
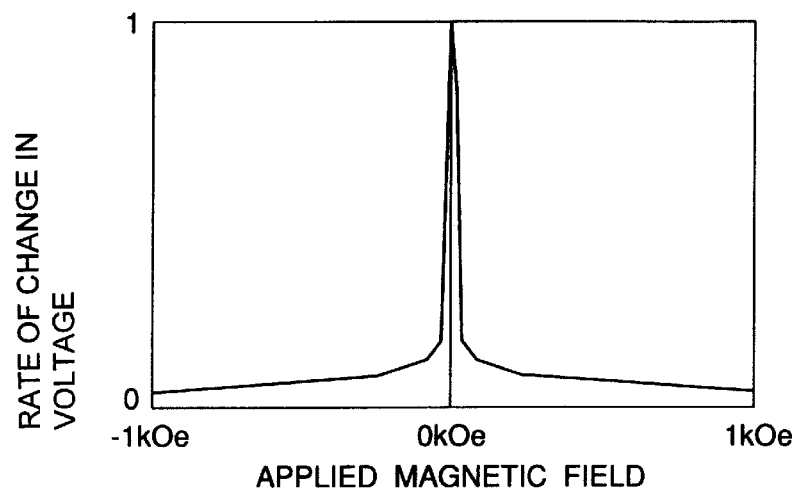
FIG. 3 is a diagram showing standardized electrical resistance as a function of applied magnetic field in the magnetic detector according to the present invention.

A change in created voltage as a function of the applied magnetic field is shown in FIG. 3. In FIG. 3, the abscissa represents the applied magnetic field, while the ordinate represents a change in voltage ($\Delta V$) based on the voltage created with no magnetic field being applied. A $\Delta V$ value of 0.5 indicates the creation of a voltage which is half the voltage created with no magnetic field being applied. FIG. 3 shows that a change of the external magnetic field by 1 kOe results in a change of the voltage by 0.9. This value is not less than two orders larger than that provided by the conventional magnetoresistive element, for example, a magnetoresistive element using a magnetic film of a permalloy. Utilization of this property can realize a magnetic detecting element having high sensitivity.

Figure 4:
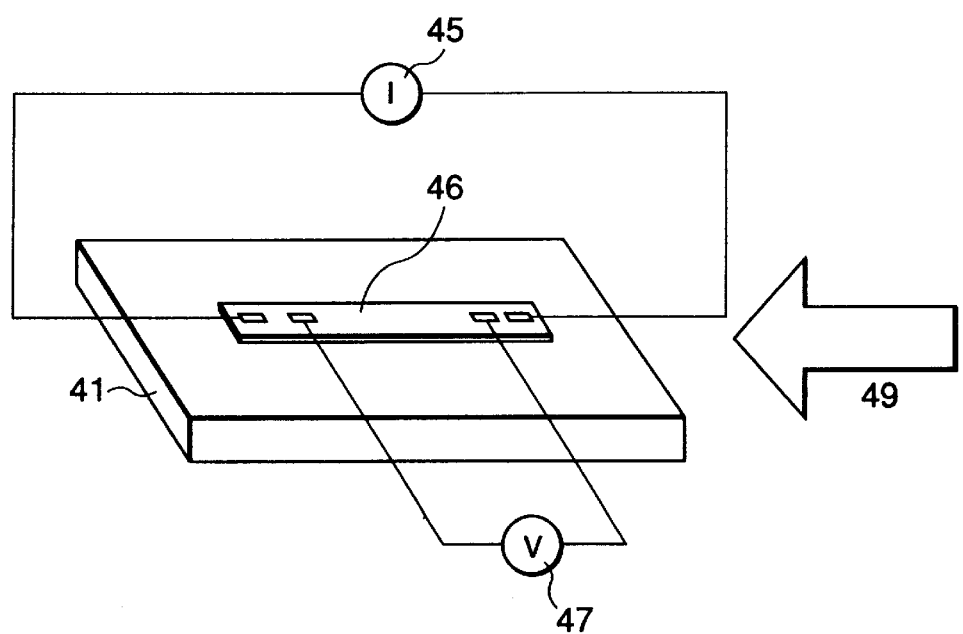
FIG. 4 is a schematic diagram showing another magnetic detecting element according to the present invention.
Figure 5:
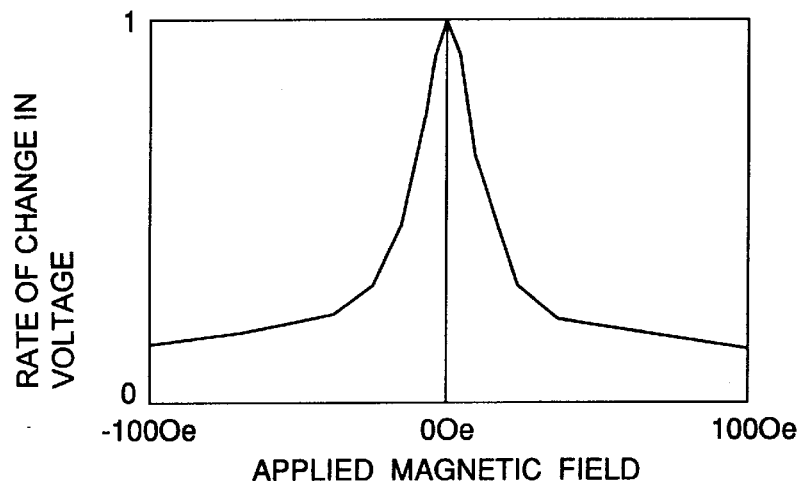
FIG. 5 is a diagram showing standardized electrical resistance as a function of applied magnetic field in another magnetic detecting element according to the present invention.

Another embodiment of the present invention will be described with reference to FIG. 4. FIG. 4 is a schematic diagram showing the magnetic detector according to the present invention. The magnetoresistive element shown in FIG. 4 comprises a substrate 41 of an MgO single crystal and a laminate film 46, of the present invention, provided on the substrate. The laminate film 46 was proceeded by photolithography and ion milling to a shape of 50×200 $\mu$m in longitudinal and width dimension. In the formation of the laminate film 46, a 500 nm-thick layer of a amorphous supermagnetostrictive material $SmFe_2$ is formed by sputtering, a 10 nm-thick layer of an insulating oxide $SrTiO_3$ is formed thereon, and a layer of an oxide magnetoresistive material $La_{0.75}Nd_{0.05}Sr_{0.15}Ca_{0.05}MnP_y$ (wherein y is 2.7 to 3.3) is formed by laser ablation. A current of 1 $\mu$A is fed from the electrode toward the film surface direction of the laminate film 46. In FIG. 4, numeral 47 designates a voltmeter which serves to detect the voltage created in the laminate film 46. Application of a magnetic field 49 in the range of −100 Oe to 100 Oe to the element so as to be parallel to the film surface of the element caused the voltage detected to be varied depending upon the intensity of the magnetic field. A change in created voltage as a function of the applied magnetic field is shown in FIG. 5. In FIG. 5, the abscissa represents the intensity of the applied magnetic field, while the ordinate represents a change in voltage ($\Delta V$) according to a change in magnetic field as in FIG. 3. A magnetic field of 50 Oe causes a $\Delta V$ value of 0.8, indicating that the voltage is about 80% lower than that created with the magnetic field being zero. This voltage change is not less than one order larger than that in the conventional magnetoresistive element. Utilization of the laminate film according to the present invention can realize a high-sensitivity, high-output magnetic detecting element.

The magnetoresistive element according to the present invention can be used as a head for a magnetic recording device by virtue of the above-described magnetoresistance effect, that is, good magnetic sensitivity and output and low power consumption.

Further, the magnetoresistive element according to the present invention can be applied to a rotation angle sensor, a position sensor, a linear gauge sensor and the like.

Figure 6:
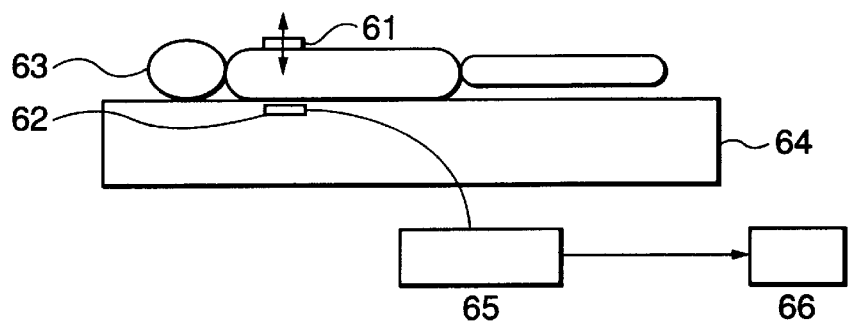
FIG. 6 is a schematic diagram showing an embodiment where the magnetoresistive element according the present invention has been applied to a domiciliary medical system.

An embodiment where the magnetoresistive element according to the present invention has been utilized in a domiciliary medical device will be described. FIG. 6 is a schematic diagram showing a domiciliary treatment device. The domiciliary treatment device shown in FIG. 6 is used to monitor the breathing of a bedridden patient or old man or woman who needs care. Numeral 63 designates a bedridden patient or old man or woman, and numeral 61 a permanent magnet placed on the breast of the bedridden patient or old man or woman. Numeral 64 designates a bed. Upon breathing, the magnet 61 periodically moves in a vertical direction. The movement of the magnet 61 corresponds to a variation in distance, in other words, a change in intensity of the magnetic field, for the magnetoresistive element of the present invention indicated by a reference numeral 62.

The magnetoresistive element 62 detects a change, in position of the magnet 61 caused by the person's breathing, as a change in magnetic field. This change is converted by means of a detector 65 to a change in voltage or a change in current derived from a change in electrical resistance to continue monitoring of the periodical displacement of the magnet 61. In this case, when there is no periodical displacement of the magnet 61, a signal is electrically or optically sent to an alarm device 66. This alarm device can be connected to a centralized monitoring system linked with an alarm, such as a buzzer, and a communication system.

Figure 7:
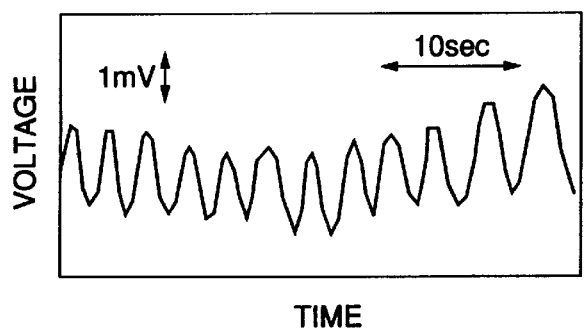
FIG. 7 is a diagram showing a change in voltage as a function of time in an embodiment where the magnetoresistive element according to the present invention has been applied to a domiciliary medical system.

A change in voltage obtained from a magnetoresistive element in the domiciliary medical device according to the present invention is shown in FIG. 7. FIG. 7 shows a change in voltage as a function of time. As shown in FIG. 7, breathing causes the magnet to be vertically moved to change the distance between the magnet and magnetoresistive element 62. This results in a change in intensity of the magnetic field which the magnetoresistive element 62 receives, causing a change in electrical resistance. The magnitude of the change is as large as several % and several mV in terms of voltage. Such a large change in voltage can be easily subjected to signal processing and enables the condition of the bedridden patient or old man or woman to be surely and accurately learned by using an inexpensive signal processor alone.

Use of a detection system utilizing the magnetoresistance effect according to the present invention permits domiciliary care for a bedridden patient or old man or woman, which has been expensive in the prior art, to be inexpensively and accurately done.

Figure 8:
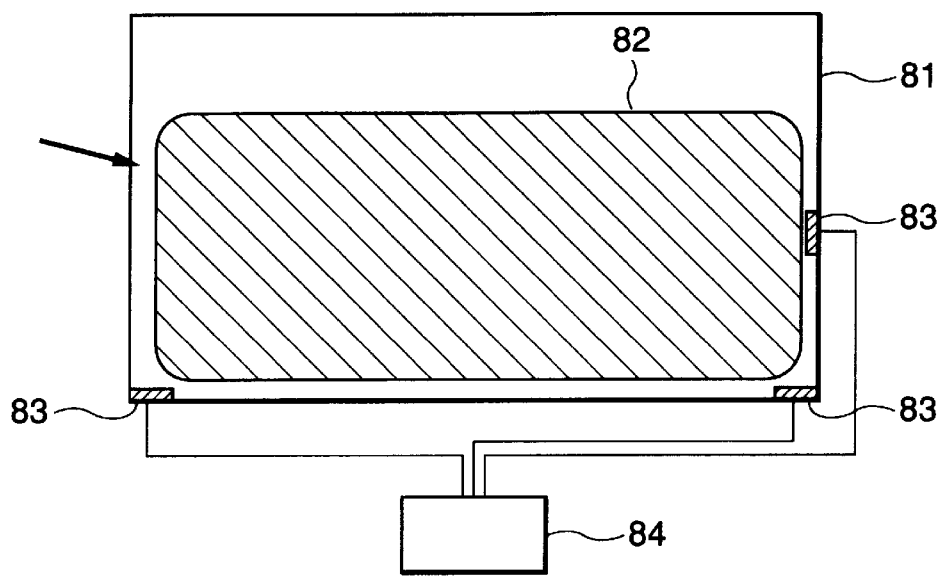
FIG. 8 is a schematic diagram showing an embodiment where the magnetoresistive element according to the present invention has been applied to an approach sensor.

An embodiment where the magnetic detecting element according to the present invention has been utilized in an approach sensor is described. FIG. 8 is a schematic diagram showing the use of an approach sensor in a sensor used for putting a car in a garage. Numeral 81 designates a garage or a carport, and numeral 82 a car. The direction of advance of the car is indicated by an arrow. When the car 82 is put in the garage or carport 81, a magnetoresistive element 83 is placed in a position, where the car approaches the garage or carport, and connected to a controller and an alarm device 84. The controller and alarm device 84 functions to permit a current to flow into the magnetoresistive element 83, to measure the voltage or current, to deliver the results of measurement to the alarm device, and to inform a driver of the results by taking advantage of a sound, light or the like.

Figure 9:
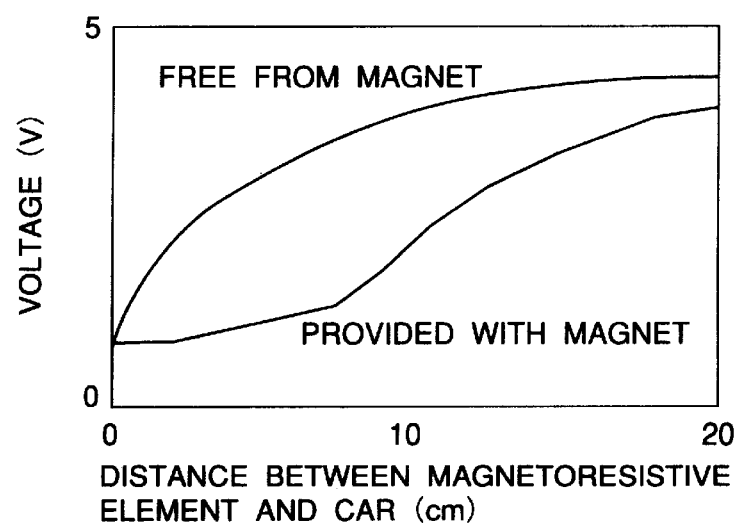
FIG. 9 is a diagram showing the relationship of the distance, between an object and a magnetoresistive element, with the voltage in an embodiment where the magnetoresistive element according to the present invention has been applied to an approach sensor.

A change in voltage, in the case where a current of 1 $\mu$A is allowed to flow into the magnetoresistive element 83 and a magnetized iron or magnet is allowed to approach, is shown in FIG. 9. In FIG. 9, the abscissa represents the distance between the magnetoresistive element and the magnetized iron or magnet, while the ordinate represents the voltage created with a current of 1 $\mu$A being fed into the magnetoresistive element. When the magnetized iron approaches the magnetoresistive element, the voltage becomes half at a distance between the magnetized iron and the magnetoresistive element of 2 to 3 cm. In the case of a ferrite magnet, the voltage becomes half at a distance of about 10 cm. Therefore, the distance can be measured by monitoring the voltage or current. Further, the sensor section of this system comprises a magnetoresistive element and, hence, is very simple in structure, highly reliable, and inexpensive.

According to the present invention, a magnetic detecting element having high sensitivity and good quick response can be provided, making it possible to provide housing equipment, medical equipment, environmental equipment, a magnetic recording device, and a magnetic measuring instrument.

According to the present invention, the approach sensor, as compared with the conventional approach sensor of mechanical, optical, dielectric or other type, is inexpensive, has better reproducibility, and needs simpler maintenance. Further, as compared with the conventional medical monitoring system, the monitoring system is less likely to influence the patient, has higher reliability, and is inexpensive. Further, when the present invention is applied to a magnetic head for magnetic recording, it is possible to provide an element having low power consumption and high output.

Further, according to the present invention, large magnetoresistance effect can be provided at room temperature by virtue of synergistic effect of the magnetostriction and the magnetoresistance effect, eliminating the need to provide cooling equipment.

Further, according to the present invention, a large voltage output is obtained even when the current value for detecting the voltage is reduced, offering an advantage that a deterioration of the element due to the generation of heat or the like can be prevented. Furthermore, according to the present invention, the voltage output is so high that there is no influence of noise created at the time of production of a signal. Thus, the detection device can be simplified, and a system is provided at a low cost.

Furthermore, according to the present invention, the change in resistance is so large that application of a given voltage results in a large change in current value, advantageously rendering the present invention usable in current control.

What is claimed is:

1. A magnetoresistive element comprising a combination of a layer of electroconductive, crystalline magnetostrictive material with an electrically insulating layer and a layer of oxide magnetoresistive material, wherein said insulating layer is formed of any one of the following materials:

$RO_y$ wherein R represents at least one element selected from the group consisting of Si, Ti, Mo, W, Zr, Ta, Cr, Al, Mg, Hf, and Ca;

$DO_y$ wherein D represents at least one rare earth element;

$JTiO_z$ wherein J represents at least one element-selected from the group consisting of Ba, Ca, Sr, and Pb, and z is 2.7 to 3.3;

$Pb_1\{(Zr, Ti), L\}_1 O_z$ wherein L represents at least one element selected from the group consisting of Ni, Mn, Cr, and Fe, in said materials, y=1.4 to 2.2 and z=2.7 to 3.3; and wherein said materials having an electrical resistance of not less than $10^7$ Ω-cm.

2. A magnetoresistive element comprising a combination of a layer of electroconductive, amorphous magnetostrictive material with an electrically insulating layer and a layer of oxide magnetoresistive material, wherein said insulating layer is formed of any one of the following materials:

$RO_y$ wherein R represents at least one element selected from the group consisting of Si, Ti, Mo, W, Zr, Ta, Cr, Al, Mg, Hf, and Ca;

$DO_y$ wherein D represents at least one rare earth element;

$JTiO_z$ wherein J represents at least one element selected from the group consisting of Ba, Ca, Sr, and Pb, and z is 2.7 to 3.3;

$Pb_1\{(Zr, Ti), L\}_1 O_z$ wherein L represents at least one element selected from the group consisting of Ni, Mn, Cr, and Fe, in said materials, y=1.4 to 2.2 and z=2.7 to 3.3; and wherein said materials having an electrical resistance of not less than $10^7$ Ω-cm.

3. A magnetoresistive element comprising a combination of a layer of electrically insulating oxide magnetostrictive material with a layer of oxide magnetoresistive material, wherein said electrically insulating oxide magnetostrictive material is any one of the following materials: $NiFe_2O_4$; $Co_1Fe_2O_4$; $Y_3Fe_5O_{12}$; $Fe_3O_4$; $(Ba, Pb)Fe_2O_4$; and $BaFe_{12}O_{19}$.

4. The magnetoresistive element according to claim 1, wherein the oxide magnetoresistive material is an oxide having a perovskite structure $DEMnO_3$ or a layer perovskite structure $DE_{2n-1}Mn_nO_{2n+1}$ wherein DE represents at least one element selected from the group consisting of rare earth elements and alkaline earth elements and n represents an integer of one or more.

5. The magnetoresistive element according to claim 2, wherein the oxide magnetoresistive material is an oxide having a perovskite structure $DEMnO_3$ or a layer perovskite structure $DE_{2n-1}Mn_nO_{2n+1}$ wherein DE represents at least one element selected from the group consisting of rare earth elements and alkaline earth elements and n represents an integer of one or more.

6. The magnetoresistive element according to claim 3, wherein the oxide magnetoresistive material is an oxide having a perovskite structure $DEMnO_3$ or a layer perovskite structure $DE_{2n-1}Mn_nO_{2n+1}$ wherein DE represents at least one element selected from the group consisting of rare earth elements and alkaline earth elements and n represents an integer of one or more.

7. The magnetoresistive element according to claim 1, wherein the electrically insulating layer is formed of an oxide material.

8. The magnetoresistive element according to claim 2, wherein the electrically insulating layer is formed of an oxide material.

9. The magnetoresistive element according to claim 1, wherein layers formed of said materials constituting the magnetoresistive element are mechanically firmly bonded to each other.

10. The magnetoresistive element according to claim 2, wherein layers formed of said materials constituting the magnetoresistive element are mechanically firmly bonded to each other.

11. The magnetoresistive element according to claim 3, wherein layers formed of said materials constituting the magnetoresistive element are mechanically firmly bonded to each other.

12. A magnetic detecting element comprising a magnetoresistive element, a means for allowing a current to flow into the oxide magnetoresistive material, and a means for detecting a voltage created in the oxide magnetoresistive material, said magnetoresistive element comprising a combination of a layer of electroconductive, crystalline magnetostrictive material with an electrically insulating layer and a layer of oxide magnetoresistive material, wherein said insulating layer is formed of any one of the following materials:

$RO_y$ wherein R represents at least one element selected from the group consisting of Si, Ti, Mo, W, Zr, Ta, Cr, Al, Mg, Hf, and Ca;

$DO_y$ wherein D represents at least one rare earth element;

$JTiO_z$ wherein J represents at least one element-selected from the group consisting of Ba, Ca, Sr, and Pb, and z is 2.7 to 3.3;

Pb$_1${(Zr, Ti), L}$_1$O$_z$ wherein L represents at least one element selected from the group consisting of Ni, Mn, Cr, and Fe, in said materials, y=1.4 to 2.2 and z=2.7 to 3.3; and wherein said materials having an electrical resistance of not less than 10$^7$ Ω-cm.

13. A magnetic detecting element comprising a magnetoresistive element, a means for allowing a current to flow into the oxide magnetoresistive material, and a means for detecting a voltage created in the oxide magnetoresistive material, said magnetoresistive element comprising a combination of a layer of electroconductive, amorphous magnetostrictive material with an electrically insulating layer and a layer of oxide magnetoresistive material, wherein said insulating layer is formed of any one of the following materials:

RO$_y$ wherein R represents at least one element selected from the group consisting of Si, Ti, Mo, W, Zr, Ta, Cr, Al, Mg, Hf, and Ca;

DO$_y$ wherein D represents at least one rare earth element;

JTiO$_z$ wherein J represents at least one element selected from the group consisting of Ba, Ca, Sr, and Pb, and z is 2.7 to 3.3;

Pb$_1${(Zr, Ti), L}$_1$O$_z$ wherein L represents at least one element selected from the group consisting of Ni, Mn, Cr, and Fe, in said materials, y=1.4 to 2.2 and z=2.7 to 3.3; and wherein said materials having an electrical resistance of not less than 10$^7$ Ω-cm.

14. A magnetic detecting element comprising a magnetoresistive element, a means for allowing a current to flow into the oxide magnetoresistive material, and a means for detecting a voltage created in the oxide magnetoresistive material, said magnetoresistive element comprising a combination of a layer of electrically insulating oxide magnetostrictive material with a layer of oxide magnetoresistive material, wherein said electrically insulating oxide magnetostrictive material is any one of the following materials: NiFe$_2$O$_4$; Co$_1$Fe$_2$O$_4$; Y$_3$Fe$_5$O$_{12}$; Fe$_3$O$_4$; (Ba, Pb)Fe$_2$O$_4$; and BaFe$_{12}$O$_{19}$.

15. The magnetoresistive element according to claim 1, wherein the oxide magnetoresistive material is any one of the following materials:

(La, Ca)$_1$Mn$_1$O$_y$; (La, Sr)$_1$Mn$_1$O$_y$; Bi$_1$Mn$_1$O$_y$; (La, A)$_1$Mn$_{1-x}$(Co, Fe, Ni)$_x$O$_y$ wherein A represents at least one element selected from Ba, Sr, Pb, and Cd; (D, E)$_1$Mn$_{1-x}$G$_x$O$_y$ wherein D represents at least one rare earth element, E represents at least one alkaline earth element and G represents at least one element selected from the group consisting of Fe, Co, Ni, and Cr; {(Pr, Nd), (Ba, Sr)}$_1$(Mn$_{1-x}$G$_x$)$_1$O$_y$; (Bi, Ca)$_1$(Mn$_{1-x}$G$_x$)$_1$O$_y$; La$_1$(Mn$_{1-x}$G$_x$)$_1$O$_y$; Gd$_1$(Mn$_{1-x}$G$_x$)$_1$O$_y$; J(L, M)$_1$O$_y$ wherein J represents at least one element selected from the group consisting of Ba, Ca, Sr, and Pb, L represents at least one element selected from the group consisting of Ni, Mn, Cr, and Fe, and M represents at least one element selected from the group consisting of W, Sb, Mo, and V; (Sr, La)$_1$Mn$_{1-x}$Q$_x$O$_y$ wherein Q represents at least one element selected from the group consisting of Co, Ni, Nb, Sb, and Ta; La$_3$Mn$_2$O$_z$; (La, J)$_3$Mn$_2$O$_z$; and (La, J)$_3$(Mn, L)$_2$O$_z$, wherein, in said formulae, x=more than 0 to 3.5, y=2.7 to 3.3, and z=5 to 8.

16. The magnetoresistive element according to claim 2, wherein the oxide magnetoresistive material is any one of the following materials:

(La, Ca)$_1$Mn$_1$O$_y$; (La, Sr)$_1$Mn$_1$O$_y$; Bi$_1$Mn$_1$O$_y$; (La, A)$_1$Mn$_{1-x}$(Co, Fe, Ni)$_x$O$_y$ wherein A represents at least one element selected from Ba, Sr, Pb, and Cd; (D, E)$_1$Mn$_{1-x}$G$_x$O$_y$ wherein D represents at least one rare earth element, E represents at least one alkaline earth element and G represents at least one element selected from the group consisting of Fe, Co, Ni, and Cr; {(Pr, Nd), (Ba, Sr)}$_1$(Mn$_{1-x}$G$_x$)$_1$O$_y$; (Bi, Ca)$_1$(Mn$_{1-x}$G$_x$)$_1$O$_y$; La$_1$(Mn$_{1-x}$G$_x$)$_1$O$_y$; Gd$_1$(Mn$_{1-x}$G$_x$)$_1$O$_y$; J(L, M)$_1$O$_y$ wherein J represents at least one element selected from the group consisting of Ba, Ca, Sr, and Pb, L represents at least one element selected from the group consisting of Ni, Mn, Cr, and Fe, and M represents at least one element selected from the group consisting of W, Sb, Mo, and V; (Sr, La)$_1$Mn$_{1-x}$Q$_x$O$_y$ wherein Q represents at least one element selected from the group consisting of Co, Ni, Nb, Sb, and Ta; La$_3$Mn$_2$O$_z$; (La, J)$_3$Mn$_2$O$_z$; and (La, J)$_3$(Mn, L)$_2$O$_z$, wherein, in said formulae, x=more than 0 to 3.5, y=2.7 to 3.3, and z=5 to 8.

17. The magnetoresistive element according to claim 3, wherein the oxide magnetoresistive material is any one of the following materials:

(La, Ca)$_1$Mn$_1$O$_y$; (La, Sr)$_1$Mn$_1$O$_y$; Bi$_1$Mn$_1$O$_y$; (La, A)$_1$Mn$_{1-x}$(Co, Fe, Ni)$_x$O$_y$ wherein A represents at least one element selected from Ba, Sr, Pb, and Cd; (D, E)$_1$Mn$_{1-x}$G$_x$O$_y$ wherein D represents at least one rare earth element, E represents at least one alkaline earth element and G represents at least one element selected from the group consisting of Fe, Co, Ni, and Cr; {(Pr, Nd), (Ba, Sr)}$_1$(Mn$_{1-x}$G$_x$)$_1$O$_y$; (Bi, Ca)$_1$(Mn$_{1-x}$G$_x$)$_1$O$_y$; La$_1$(Mn$_{1-x}$G$_x$)$_1$O$_y$; Gd$_1$(Mn$_{1-x}$G$_x$)$_1$O$_y$; J(L, M)$_1$O$_y$ wherein J represents at least one element selected from the group consisting of Ba, Ca, Sr, and Pb, L represents at least one element selected from the group consisting of Ni, Mn, Cr, and Fe, and M represents at least one element selected from the group consisting of W, Sb, Mo, and V; (Sr, La)$_1$Mn$_{1-x}$Q$_x$O$_y$ wherein Q represents at least one element selected from the group consisting of Co, Ni, Nb, Sb, and Ta; La$_3$Mn$_2$O$_z$; (La, J)$_3$Mn$_2$O$_z$; and (La, J)$_3$(Mn, L)$_2$O$_z$, wherein, in said formulae, x=more than 0 to 3.5, y=2.7 to 3.3, and z=5 to 8.

18. A magnetoresistive element comprising a combination of a layer of electroconductive, crystalline magnetostrictive material with an electrically insulating layer and a layer of oxide magnetoresistive material, wherein the electroconductive, crystalline magnetostrictive material is a material containing not less than 50% by volume of any one of the following materials:

T(Fe$_{1-x}$X$_x$)$_2$; T(Fe$_{1-x}$X$_x$)$_3$; T$_6$(Fe$_{1-x}$X$_x$)$_{23}$; and T$_2$(Fe$_{1-x}$X$_x$)$_{17}$, wherein T represents at least one element selected from the group consisting of Tb, Dy, Ho, Sm, Gd, Tm, and Er, X represents at least one element selected from the group consisting of Ti, V, Cr, Mn, Co, Ni, and Cu, and x=more than 0 to 0.5.

19. A magnetoresistive element comprising a combination of a layer of electroconductive, amorphous magnetostrictive material with an electrically insulating layer and a layer of oxide magnetoresistive material, wherein the electroconductive, amorphous magnetostrictive material is a material containing not less than 50% by volume of any one of the following materials:

T(Fe$_{1-x}$X$_x$)$_2$Z$_y$; T(Fe$_{1-x}$X$_x$)$_3$Z$_y$; T$_6$(Fe$_{1-x}$X$_x$)$_{23}$Z$_y$; and T$_2$(Fe$_{1-x}$X$_x$)$_{17}$Z$_y$, wherein T represents at least one element selected from the group consisting of Tb, Dy, Ho, Sm, Gd, Tm, and Er, X, represents at least one element selected from the group consisting of Ti, V, Cr, Mn, Co, Ni, and Cu, Z represents at least one element selected from the group consisting of B, C, Si, P, S, As, Se, Sb, and Te, x=more than 0 to 0.5, and y=more than 0 to 0.1.

* * * * *